United States Patent
Hezar et al.

(10) Patent No.: US 9,065,476 B2
(45) Date of Patent: Jun. 23, 2015

(54) TWO ADJACENT BIT VALUES SWITCHING CURRENT SOURCE BETWEEN THREE PATHS

(71) Applicant: Texas Instruments Incorporated, Dallas, TX (US)

(72) Inventors: Rahmi Hezar, Allen, TX (US); Baher Haroun, Allen, TX (US); Halil Kiper, Somerville, MA (US); Mounir Fares, Murphy, TX (US); Ajay Kumar, Phoenix, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 130 days.

(21) Appl. No.: 13/887,918

(22) Filed: May 6, 2013

(65) Prior Publication Data

US 2013/0241758 A1    Sep. 19, 2013

Related U.S. Application Data

(62) Division of application No. 13/134,301, filed on Jun. 3, 2011, now Pat. No. 8,456,341.

(51) Int. Cl.
*H03M 1/66* (2006.01)
*H03M 1/74* (2006.01)
*H03M 3/00* (2006.01)

(52) U.S. Cl.
CPC ............... *H03M 1/66* (2013.01); *H03M 1/747* (2013.01); *H03M 3/464* (2013.01)

(58) Field of Classification Search
CPC ........ H03M 1/66; H03M 1/747; H03M 3/464
USPC .................................... 341/144, 118, 120, 172
See application file for complete search history.

(56) References Cited

U.S. PATENT DOCUMENTS

| | | | | |
|---|---|---|---|---|
| 3,927,401 | A | * | 12/1975 | McIntosh ....................... 341/57 |
| 5,134,402 | A | * | 7/1992 | Miyoshi ....................... 341/144 |
| 5,608,401 | A | * | 3/1997 | Viswanathan et al. ........ 341/144 |
| 7,042,378 | B2 | * | 5/2006 | Van Veldhoven ............. 341/144 |

* cited by examiner

*Primary Examiner* — Brian Young
(74) *Attorney, Agent, or Firm* — Lawrence J. Bassuk; Frank D. Cimino

(57) ABSTRACT

A system for processing a signal includes a detector configured to detect a two-level stream of bits; a converter configured to generate a three-level control signal based on two adjacent values within the two-level stream of bits; and a switch configured to determine which of three different paths to couple a current source to based on a value of the three-level control signal. Thus, based on adjacent values of the output stream a three-level control signal is generated which controls coupling of the current source to one of three different paths. This type of three-level digital-to-analog converter can be, for example, part of the feedback loop of an analog-to-digital converter. Similar techniques can also be utilized in a multi-segment digital-to-analog converter in which each segment of the DAC is controlled by a 3-level control signal and the DAC is implement using PMOS devices. The current source for each DAC segment is diverted to ground, the M-node, or the P-node depending on the value of the 3-level control signal.

7 Claims, 3 Drawing Sheets

TWO ADJACENT BIT VALUES SWITCHING CURRENT SOURCE BETWEEN THREE PATHS

This application is a Divisional of prior application Ser. No. 13/134,304, filed Jun. 3, 2011, now U.S. Pat. No. 8,456,341, issued Jun. 4, 2013.

BACKGROUND

1. Field

The present invention relates generally to signal processing and, more particularly, to digital to analog conversion.

2. Description of Related Art

One of the major limitations in high fidelity low power audio design, such as for headsets, is thermal noise of the DAC components. In a typical DAC design, thermal noise is a fixed value once the maximum output voltage and load requirements are determined DAC output referred thermal noise at the driver output does not change even if the signal swing is reduced. Because of this, in order to provide acceptable idle channel noise characteristics, the DAC device is usually relatively large that leads to inefficient use of chip space and high power consumption.

One attempt at a solution is to provide a three-level digital-to-analog converter using both PMOS and NMOS devices as matched current courses. However, this solution introduces a number of issues. For example, there must be almost perfect matching between each PMOS device and its corresponding NMOS device. Mismatch between PMOS and NMOS devices creates significant linearity issues that affect the overall chain and the subsequent amplifier design. Additionally, using NMOS devices makes it more difficult to isolate noise.

Digital-to-analog converters can be used in an open-loop configuration and can also be used in the feedback loop of a sigma-delta converter. One existing discrete-time second-order order delta-sigma ADC design is the active-passive delta-sigma modulation (APDSM) ADC. APSDM ADCs are subject to resistor and capacitor absolute value variances and excess loop delay and parasitic poles. Variances in resistor and capacitor absolute value tend to cause large absolute ADC gain variations and the movement of poles and zeros, which degrades performance and stability. Counteracting these vulnerabilities requires extra circuitry to control the reference voltage so that the absolute gain of the ADC does not vary substantially. Excess loop delay and parasitic poles vulnerabilities require the amplifier, comparator, and DAC to meet delay requirements over an expected range of frequencies. Further, a loop delay compensation circuit may be required to reduce sensitivity to quantizer metastability, latch clock-to-Q time, and feedback DAC propagation delay. Also, APSDM ADCs may require that the input common mode voltage be level-shifted for proper operation and reliability. This requires additional circuits for level-shifting, which consume additional chip area and power.

In addition to the design constraints mentioned above, in a typical, existing second-order sigma-delta APSDMs, the feedback DAC is a single bit DAC. This single bit DAC is switched so as to be connected to the plus and minus sides of the input for half of a given time period. Thus, the value of the common mode bleed resistors are chosen to provide a desired common mode voltage drop when a current ($I_{DAC}/2$) passes through each bleed resistor. The undesired result is that the noise of the first stage integrator (passive) is referred back to the input stage and, as a result, amplified. Thus, the noise floor of the APSDM is limited.

There remains a need for an improved architecture for a three-level digital-to-analog converter that addresses at least some of the shortcomings of the current architectures described above.

BRIEF SUMMARY

Embodiments of the present invention relate to a system and method for processing a signal. In general, a two-level stream of bits is used to produce a three-level control signal that can be utilized in either a closed-loop or open-loop configuration.

In the closed-loop configuration, a system for processing a signal includes a receiver configured to receive an input analog signal having a positive input and a minus input; a converter configured to quantize the input analog signal into a two-level output stream; a summing junction configured to selectively couple a current source to one of the minus input, the positive input, and a current sink; and a signal generator configured to generate a three-level control signal based on the two-level output stream to control operation of the summing junction. Thus, when adjacent values of the output stream of the quantizer are different, the current source can be coupled to a current sink instead of one of the signal inputs. In both an open-loop and closed-loop configuration, this architecture provides a significantly reduced noise floor.

In an open-loop configuration, a multi-segment digital to analog converter is provided in which each segment of the DAC is controlled by a respective 3-level control signal and the DAC stages are implemented using PMOS devices. The current source for each DAC segment is diverted to ground, the M-node, or the P-node depending on the value of the 3-level control signal for that stage.

It is understood that other embodiments of the present invention will become readily apparent to those skilled in the art from the following detailed description, wherein it is shown and described only various embodiments of the invention by way of illustration. As will be realized, the invention is capable of other and different embodiments and its several details are capable of modification in various other respects, all without departing from the spirit and scope of the present invention. Accordingly, the drawings and detailed description are to be regarded as illustrative in nature and not as restrictive.

BRIEF DESCRIPTION OF DRAWINGS

Various aspects of embodiments of the invention are illustrated by way of example, and not by way of limitation, in the accompanying drawings, wherein.

DETAILED DESCRIPTION

The detailed description set forth below in connection with the appended drawings is intended as a description of various embodiments of the invention and is not intended to represent the only embodiments in which the invention may be practiced. The detailed description includes specific details for the purpose of providing a thorough understanding of the invention. However, it will be apparent to those skilled in the art that the invention may be practiced without these specific details. In some instances, well known structures and components are shown in block diagram form in order to avoid obscuring the concepts of the invention.

A three-level digital-to-analog converter is described in two different configurations. The first configuration is with respect to FIG. 1. In this configuration, the DAC is part of the feedback loop of an analog-to-digital converter. The second configuration is with respect to FIGS. 2 and 3 and illustrates an open-loop configuration of the three-level DAC. Thus, embodiments of the present invention relate to a three-level DAC in either a closed-loop or open-loop configuration.

Figure 1:
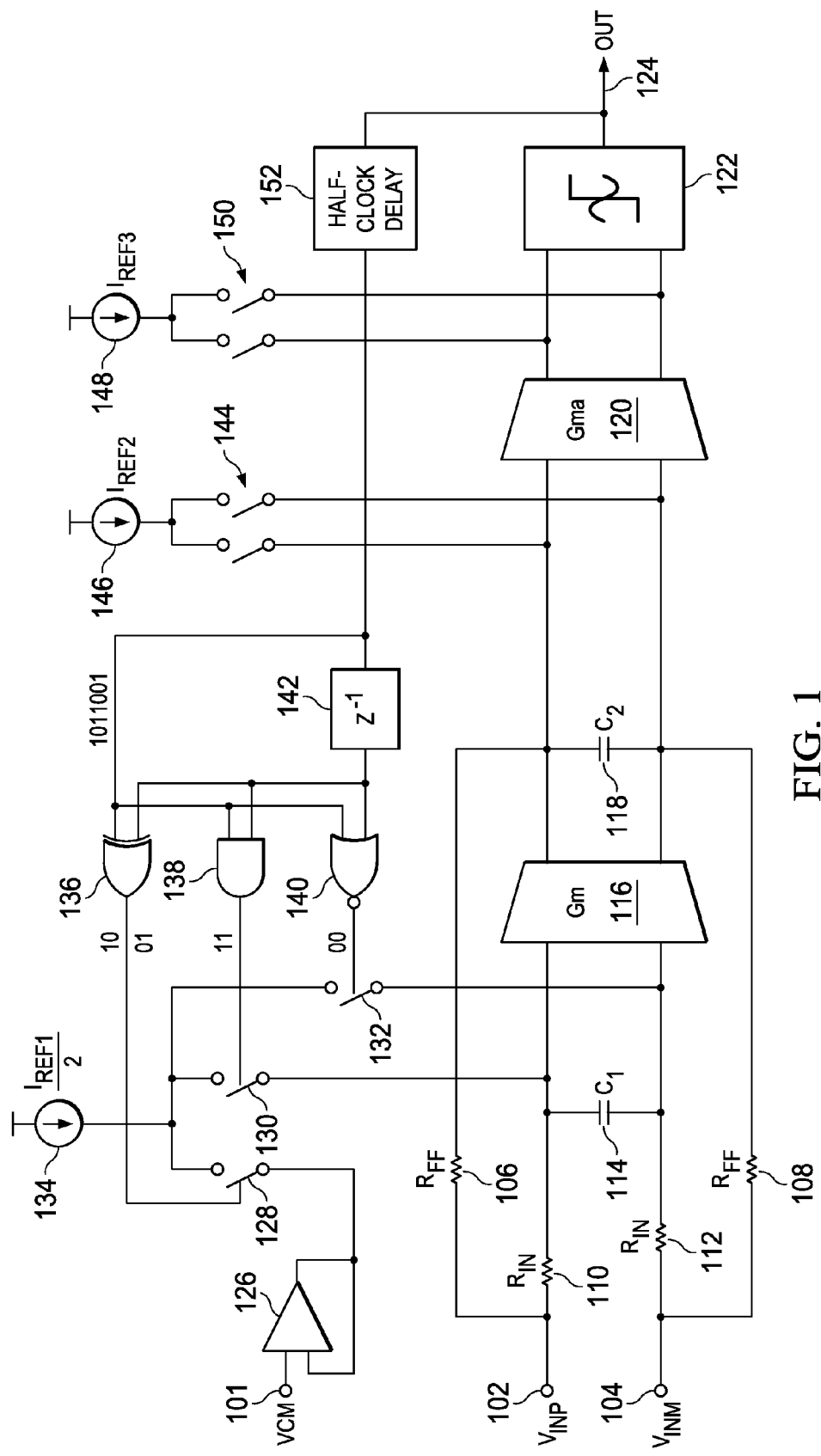
FIG. 1 depicts an architecture of an improved APSDM in accordance with the principles of the present invention.

FIG. 1 depicts an improved APSDM architecture in accordance with the principles of the present invention. The APSDM architecture 100 includes a positive input 102 and a minus input 104. There is also a common mode voltage circuit 101 that along with the amplifier 126 acts like a current sink as described in more detail below. For example, the common mode voltage 101 may be about 500 mV which swings plus or minus 100 mV between 400 mV and 600 mV. One of ordinary skill will recognize that these values are provided as examples only and different values may be used. The circuitry 100 of FIG. 1 is typically used in a scenario where the input signal is oversampled. For example a 2 MHz input signal may be oversampled at a rate of 500 MHz. This overclocked frequency controls the timing of the switches 144 and 150 coupled with the current references 146 and 148, respectively.

Each input 102, 104 has a respective feed-forward resistor 106, 108 and an input resistor 110, 112. A capacitor 114 bridges across the input signal lines before they reach the first amplifier 116 whose outputs, across the capacitor 118, are provided back to the respective feed-forward resistors 106, 108. A second amplifier 120 is reached and then the quantizer 122.

The output 124 of the quantizer 122 is also fed back through a half-clock delay 152 where it can be summed with the signal being input. However, the particular way the output 124 is summed is controlled by the three switches 128, 130, and 132. In particular, the signal from the half-clock delay 152 is delayed by 1 clock period using delay circuit 142. Thus the gates 136, 138, 140 each have two inputs with one being a current output from the quantizer and the other being the previous output from the quantizer. Gate 136 is an exclusive OR gate, gate 138 is an AND gate and gate 140 is a NOR gate. As a result, when adjacent values in the output stream are "00", then gate 140 is active. When the adjacent values in the output stream are "11", then gate 138 is active. And when the adjacent values of the output stream are "01" or "10", which is the most common case in the present oversampled scenario, then gate 136 is active.

As a result of the gate logic just described, the voltage of the summing junction does not change for alternate "1" and "0" patterns. Instead, the $I_{DAC}$ (e.g., $I_{REF1}/2$) 134 can be connected to the $V_{cm}$ 101 that acts like a current sink. When the pattern "11" is encountered then the summing junction goes higher (coupled with $V_{INP}$) and when the pattern "00" is encountered, then the summing junction goes lower (coupled with $V_{INM}$).

Example values for the components in FIG. 1 can include $I_{REF}1=40$ µA, $I_{REF}2=15$ µA, $I_{REF}3=1.5$ µA, $R_{IN}=24.5$ kΩ, $R_{FF}=65.4$ kΩ, C1=23.9 pF, C2=7.98 pF, Gm=1.56 mS, Gma=1 mS, and the clock is between about 450 MHZ and 550 MHz.

By connecting the $I_{DAC}$ to VCM when the alternating pattern "0" and "1" are encountered, there need for a common mode bleed resistor is eliminated and the $I_{DAC}$ is connected to the signal path for only a short amount of time when either the pattern "00" or "11" is encountered. Because $I_{DAC}$ is connected to VCM for most of the time, the noise requirements for $I_{DAC}$ can be relaxed and the noise of Gm can be relaxed as it does not see the amplification factor of $((R_{CM}+R_{IN})/R_{CM})$. In summary, the $R_{eqNoise}$ of the structure of FIG. 1 is equal to $(R_N+3n_{GM})$.

Figure 2:
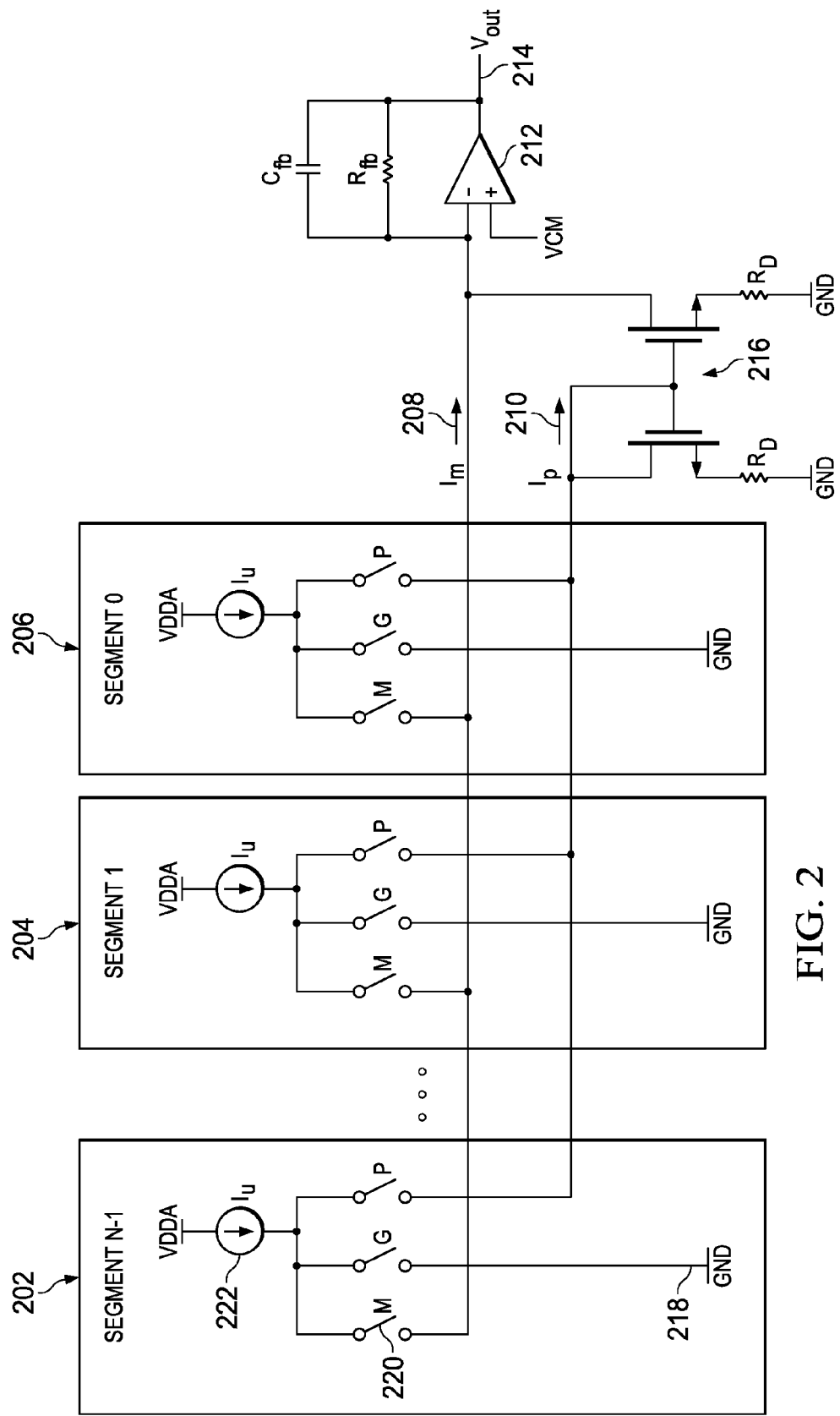
FIG. 2 depicts an architecture of a three-level digital-to-analog converter in accordance with the principles of the present invention.

FIG. 2 depicts an architecture of an open-loop three-level digital-to-analog converter in accordance with the principles of the present invention. The architecture of FIG. 2 uses 3-state PMOS current DAC elements with differential output currents. In the "−1" state the current from the PMOS source is diverted to the N-node, in the "0" state the current from the PMOS source is diverted to the ground noise, and in the "+1" state the current is diverted to the P-node. There are various ways to generate the 3-state control signal for the DAC element. For example, it can be generated from the regular 2-level control signal via simple averaging. The control signal can also be generated based on the sigma-delta modulator output. In either case, for a small signal swing most of the DAC elements will be in the "0" state and will be diverted to ground. Under these conditions, these elements will not be contributing noise to the output. Only in the full swing mode will the DAC elements be diverted to the output. However, thermal noise need not be as low under these conditions because of the human ear's psychoacoustic properties, wherein hearing quality is less sensitive to the thermal noise because of the large signal domination.

As mentioned previously, when both NMOS and PMOS devices are used to try to implement a 3-level DAC, there are significant linearity issues that affect the DAC chain and subsequent amplifier design. Also, the NMOS and PMOS currents must be a near-perfect match and any mismatch shaping is effective only at the $1^{st}$ order. Thus, the architecture of FIG. 2 eliminates NMOS devices and achieves noise reduction with only PMOS devices.

The architecture of FIG. 2 represents a multiple segment DAC. For example there can be 32 segments which are shown as individual segments 202, 204, and 206. For each segment, there is a current $I_u$ that is diverted to either ground 218, the M-node current 208 or the P-node current 210. These DAC output differential currents are converted into a single-ended current using the current mirror 216 and provide through the amplifier 212 a single-ended voltage output 214 that can be used with devices such as headphones.

Each of the segments 202, 204, 206 has a respective 3-level control signal 220 that determines where the respective current $I_u$ for each segment is diverted. Embodiments of the present invention use the present DAC segment sample and a one cycle delayed DAC segment sample to generate the 3-level control signal. Thus, the current 2-level DAC signals can be used to generate the 3-level control signal.

Figure 3:
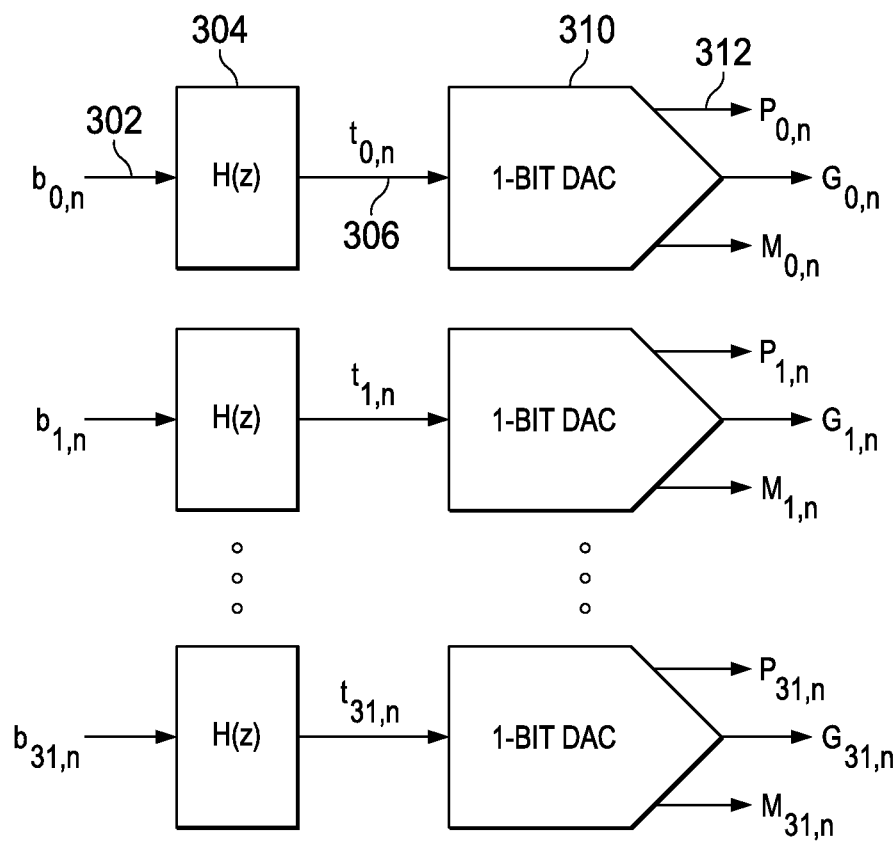
FIG. 3 depicts a signal processing model for generating a 3-level control signal from 2-level samples in accordance with the principles of the present invention.

FIG. 3 depicts a signal processing model for generating a 3-level control signal from 2-level samples in accordance with the principles of the present invention. In the example model of FIG. 3, there is depicted a system for a 32-segment DAC. However, one of ordinary skill will recognize that the present invention is not limited to a 32-segment DAC and that other numbers of segments are contemplated within the scope of the present invention. Also, the techniques described for generating and using the 3-level control signals applies to each segment of the DAC and so the operation is explicitly described in relation to only a single segment of the DAC.

A 2-level, or binary, signal chain 302 is produced by a DAC segment and transformed by a transfer function 304 into a 3-level control signal 306. This 3-level control signal 306 is then used to control the behavior of a DAC segment 310 using the three control signals 312.

One useful transfer function 304 is $H(z)=1+z^{-1}$ where the 3-level signal 306 is $t_{k,n}=b_{k,n}+b_{k,n-1}$. Using these parameters the following table represents the resulting signals for each DAC segment:

| $b_{k,n}$ | $b_{k,n-1}$ | Level | P | G | M |
|---|---|---|---|---|---|
| 0 | 0 | −1 | 0 | 0 | $I_u$ |
| 0 | 1 | 0 | 0 | $I_u$ | 0 |
| 1 | 0 | 0 | 0 | $I_u$ | 0 |
| 1 | 1 | 1 | $I_u$ | 0 | 0 |

The P, G, and M signals from the table are the control signals 220 for each segment of the DAC. Thus, the two most recent samples from the bit stream are used to control the DAC segment so that the current from the PMOS source 222 is diverted to ground 218, the P-node 210 or the M-node 208. Accordingly use of NMOS devices to produce differential currents is unnecessary.

The previous description is provided to enable any person skilled in the art to practice the various embodiments described herein. Various modifications to these embodiments will be readily apparent to those skilled in the art, and the generic principles defined herein may be applied to other embodiments. Thus, the claims are not intended to be limited to the embodiments shown herein, but are to be accorded the full scope consistent with each claim's language, wherein reference to an element in the singular is not intended to mean "one and only one" unless specifically so stated, but rather "one or more." All structural and functional equivalents to the elements of the various embodiments described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. Also, the term "exemplary" is meant to indicate that some information is being provided as an example only as is not intended to mean that that information is somehow special or preferred. No claim element is to be construed under the provisions of 35 U.S.C. §112, sixth paragraph, unless the element is expressly recited using the phrase "means for" or, in the case of a method claim, the element is recited using the phrase "step for."

What is claimed is:

1. A method of processing a signal, comprising:
   receiving an input analog signal at a positive input and a negative input;
   quantizing the analog signal to produce a two-level stream of bits;
   detecting the two-level stream of bits, the two-level stream of bits having a value of 1 at a first level and a value of 0 at a second level;
   generating a three-level control signal based on two adjacent values within the two-level stream of bits; and
   determining to which of three different paths to couple a current source based on a value of the three-level control signal, the three different paths including a current sink, the positive input, and the negative input.

2. The method of claim 1, in which the current source is coupled to the current sink when the two adjacent values are a 0 and a 1.

3. The method of claim 1 in which the current source is coupled to the positive input when the two adjacent values are both a 1.

4. The method of claim 1 in which the current source is coupled to the negative input when the two adjacent values are both a 0.

5. A system for processing a signal, comprising:
   receiver circuitry configured to receive an input analog signal having a positive input and a negative input;
   quantizer circuitry configured to quantize the input analog signal into a two-level stream of bits, the two-level stream of bits having a value of 1 at a first level and a value of 0 at a second level;
   detector circuitry configured to detect the two-level stream of bits;
   converter circuitry configured to generate a three-level control signal based on two adjacent values within the two-level stream of bits; and
   switch circuitry configured to determine to which of three different paths to couple a current source based on a value of the three-level control signal, in which the three different paths include a current sink, the positive input, and the negative input.

6. The system of claim 5 including a delay circuit coupled between the quantizer circuitry and the detector circuitry.

7. The system of claim 5 in which the switch circuitry includes a three-way switch having the two adjacent values as input, a first output being an exclusive OR of the input, a second output being an AND of the input, and a third output being a NOR of the input.

* * * * *